(12) United States Patent
Han et al.

(10) Patent No.: US 11,384,408 B2
(45) Date of Patent: Jul. 12, 2022

(54) SURFACE TREATMENT METHOD OF METALLIC MATERIALS

(71) Applicant: XI'AN JIAOTONG UNIVERSITY, Shaanxi (CN)

(72) Inventors: Weizhong Han, Shaanxi (CN); Pingjiong Yang, Shaanxi (CN)

(73) Assignee: XI'AN JIAOTONG UNIVERSITY, Shaanxi (CN)

(*) Notice: Subject to any disclaimer, the term of this patent is extended or adjusted under 35 U.S.C. 154(b) by 106 days.

(21) Appl. No.: 16/457,579

(22) Filed: Jun. 28, 2019

(65) Prior Publication Data

US 2019/0323102 A1    Oct. 24, 2019

(30) Foreign Application Priority Data

Jun. 29, 2018 (CN) .......................... 201810717759.X

(51) Int. Cl.
| | |
|---|---|
| *C23C 8/14* | (2006.01) |
| *C21D 9/46* | (2006.01) |
| *C22C 38/22* | (2006.01) |
| *C22C 38/24* | (2006.01) |
| *C22C 38/26* | (2006.01) |
| *C22C 38/28* | (2006.01) |
| *C23C 8/80* | (2006.01) |
| *C23C 8/12* | (2006.01) |
| *C23C 8/02* | (2006.01) |
| C23C 16/02 | (2006.01) |

(52) U.S. Cl.
CPC ................ *C21D 9/46* (2013.01); *C22C 38/22* (2013.01); *C22C 38/24* (2013.01); *C22C 38/26* (2013.01); *C22C 38/28* (2013.01); *C23C 8/02* (2013.01); *C23C 8/12* (2013.01); *C23C 8/14* (2013.01); *C23C 8/80* (2013.01); *C23C 16/0227* (2013.01)

(58) Field of Classification Search
CPC .... C23C 8/02; C23C 8/12; C23C 8/14; C23C 8/80
See application file for complete search history.

(56) References Cited

U.S. PATENT DOCUMENTS

2020/0318684 A1* 10/2020 Yamahara ................. C22F 1/18

OTHER PUBLICATIONS

NPL titled: "Vacuum Oxygen Permeation Treatment of Ti6Al4V Titanium Alloy Surface", Yang Chuang et al., Surface Technology, vol. 46, No. 5, pp. 165-170, May 31, 2017 as cited in the CN rejection. (Year: 2017).*

* cited by examiner

*Primary Examiner* — Hai Y Zhang

(57) ABSTRACT

A surface treatment method of metallic materials provided by the present invention includes steps of: (S1) cleaning a surface of an initial metallic material to be treated, and then drying; and (S2) placing the dried metallic material in a heating furnace, adjusting a vacuum degree inside the heating furnace to a preset value under the protection of a mixed flowing gas of oxygen and an inert gas, heating and preserving, cooling to room temperature by furnace cooling, and completing the surface treatment of the metallic material to be treated, wherein the heating temperature is larger than the destruction temperature of the native oxide at the surface of the initial metallic material. The present invention is able to increase the surface hardness of the metallic material within a large depth, and has the advantages of low processing cost, high efficiency, good controllability, convenient operation and low surface contamination for the workpiece.

1 Claim, 2 Drawing Sheets

SURFACE TREATMENT METHOD OF METALLIC MATERIALS

CROSS REFERENCE OF RELATED APPLICATION

The present invention claims priority under 35 U.S.C. 119(a-d) to CN 201810717759.X, filed Jun. 29, 2018.

BACKGROUND OF THE PRESENT INVENTION

Field of Invention

The present invention relates to the field of metallic material processing, and more particularly to a surface treatment method of metallic materials.

Description of Related Arts

In daily production and life, metallic structural components usually work under relatively complicated stress conditions, such as bending, torsion, friction and wear, which requires high hardness, wear resistance and fatigue resistance for the surface, and sufficient toughness for the core. Therefore, large amounts of surface treatment methods of metallic materials have emerged.

As the most mature and most commonly used steel surface treatment processes, carburizing and nitriding are widely used in friction plates, pistons, gears and other structural components in modern industrial production. The so-called carburizing/nitriding is a chemical heat treatment process to form carbide/nitride reinforced surface by increasing the carbon content/nitrogen content at the surface region of the workpiece. However, in the long-term industrial practice, these two typical processes inevitably exhibit many shortcomings. While gas carburization is the most widely used treatment method in surface strengthening, internal oxidation and surface decarburization are two inevitable problems. Since the typical carbirization atmosphere contains carbon dioxide and water vapor, oxygen is inevitably absorbed by the workpiece, causing oxidation in the workpiece and forming oxides at the surface grain boundaries in severe cases. Subsequent heating, quenching and shot peening process will easily introduce pockmarks at the surface and contribute to the scrapping of the workpiece. At the same time, oxidizing atmospheres such as oxygen, water vapor and carbon dioxide in the carburizing atmosphere can readily react with carbon in the steel, causing decarburization on the surface of steel. Surface decarburization is believed to decrease the surface hardness, and introduce harmful residual tensile stress at surface region. In this way, the surface fatigue strength is decreased. Meanwhile, the carburization medium used in the carburizing process is easily decomposed under high temperature, causing serious pollution to the heating furnace. Thus, it is necessary to clean the heating furnace periodically in real production. For the nitridation process, since the solubility of nitrogen in the steel is limited and its diffusion rate is relatively low, the corresponding treatment time is long and the nitridation layer is thin. Hence, the cost for nitridation is relatively high the achieved workpiece can hardly bear extremely high contact stress during service.

In recent years, with the development of surface nanocrystallization of the metallic materials, numerous advanced surface strengthening technologies have been introduced, such as shot peening, surface mechanical grinding, and laser shock peening. The surface nanocrystallization of metallic material means that the surface grain size is refined to the nanometer scale through severe plastic deformation at the metal surface, with the formation of gradient distribution of the grain size from the surface to the inside of the matrix. The surface nanocrystalline layer of the gradient structure has high strength and high hardness, while the core region maintains good plasticity. Therefore, the metallic material has good wear resistance and high fatigue life. However, as a surface treatment technique based on severe plastic deformation, the controllability of the gradient structure is poor, and the depth of surface strengthening layer is limited. In this way, the treated workpiece can hardly withstand extremely high contact stress. In addition, the surface nanocrystallization technique requires low surface roughness and high finish of initial workpiece. Furthermore, this technology also has many other problems such as severe temperature rise during processing and contamination of the processing surface by the cooling medium, which greatly affects the surface treatment effect of the workpiece.

In summary, although the above method is able to strengthen the surface of metallic materials, they still have some problems, and is unable to meet the requirements of low cost, high efficiency, good controllability, convenient operation, and low surface contamination of the industrial production.

SUMMARY OF THE PRESENT INVENTION

An object of the present invention is to overcome the above disadvantages of the prior art and provide a surface treatment method of metallic materials, which is able to enhance the surface hardness of the metallic materials, and has low processing cost, high efficiency, good controllability, convenient operation and low contamination of the surface of the workpiece.

In order to achieve the above object, the surface treatment method of the metallic materials provided by the present invention comprises steps of:

(S1) cleaning a surface of an initial metallic material to be treated, and then drying; and (S2) placing the dried metallic material in a heating furnace, adjusting a vacuum degree inside the heating furnace to a preset value under a protection of a mixed flowing gas of oxygen and an inert gas, heating and preserving, cooling to a room temperature by furnace cooling, and completing a surface treatment of the metallic material to be treated, wherein a heating temperature is larger than a destruction temperature of a dense and native oxide at the surface of the initial metallic material.

Preferably, the dried metallic material is placed in the heating furnace, the vacuum degree inside the heating furnace is adjusted to the preset value under the protection of the mixed flowing gas of the oxygen and the inert gas, heated and preserved, cooled to the room temperature by furnace cooling, the oxide layer on the surface of the cooled metallic material is removed, the surface of the removed metallic material is cleaned, and the surface treatment of the metallic material to be treated is completed, wherein the heating temperature is larger than the destruction temperature of the dense and native oxide at the surface of the initial metallic material.

Preferably, the metallic material is vanadium, niobium, tantalum, chromium, molybdenum, magnesium, titanium, zirconium, iron, vanadium alloy, niobium alloy, tantalum alloy, chromium alloy, molybdenum alloy, magnesium alloy, titanium alloy, zirconium alloy, or steel, wherein: a content of vanadium, niobium, tantalum, chromium, molybdenum, magnesium, titanium, zirconium, iron in the vanadium alloy, niobium alloy, tantalum alloy, chromium alloy, molybdenum alloy, magnesium alloy, titanium alloy, zirconium alloy, and steel exceeds 5 at. %, respectively.

Preferably, a volume ratio of oxygen in the mixed gas formed by the oxygen and the inert gas is in a range of 0.01% to 100%.

Preferably, the vacuum degree inside the heating furnace is adjusted to $10^{-3}$ Pa-$10^5$ Pa under the protection of the mixed flowing gas of the oxygen and the inert gas.

Preferably, a preserving time is larger than 1 min.

Preferably, the oxide layer on the surface of the cooled metallic material is removed by at least one process selected from a group consisting of mechanical grinding, turning, pickling, and electrolytic polishing.

Beneficial effects of the present invention are as follows.

In the specific operation of the surface treatment method provided by the present invention, the metallic material to be treated is placed in the heating furnace, and the vacuum degree is adjusted to the preset value under the protection of the mixed flowing gas of the oxygen and the inert gas, and then the metallic material is heated and preserved, so that oxygen is catalyzed by the surface of the metallic material to form oxygen ions or oxygen atoms, the oxygen ions or oxygen atoms rapidly diffuse from the surface to the inside of the metallic material, thereby causing the content of oxygen element in the metallic material gradually decreased from the outside surface to the interior of the matrix to form the gradient distribution. Since the oxygen solutes can pose strong pinning effect to hinder dislocation movement in the metallic material, the significant strengthening effect is produced, wherein the higher the content, the more obvious the strengthening effect is, so that the reinforcement of the surface of the metallic material is realized, and the operation is simple and convenient. In the actual operation, the quantitative adjustment of the gradient distribution of the oxygen element is realized by adjusting the content of oxygen in the mixed gas. Moreover, in the actual operation, the present invention only needs to introduce and heat the mixed gas, and is convenient in operation, low in cost, high in processing efficiency and suitable for mass production, and has no pollution to the surface of the metallic material.

Further, by removing the oxide layer on the surface of the metallic material formed during the treatment, the brittle oxide layer on the surface of the metallic material is eliminated, so that the surface quality of the workpiece is better and cracks are less likely to occur during service.

DETAILED DESCRIPTION OF THE PREFERRED EMBODIMENT

The present invention will be further described in detail below with accompanying drawings as follows.

Figure 1:
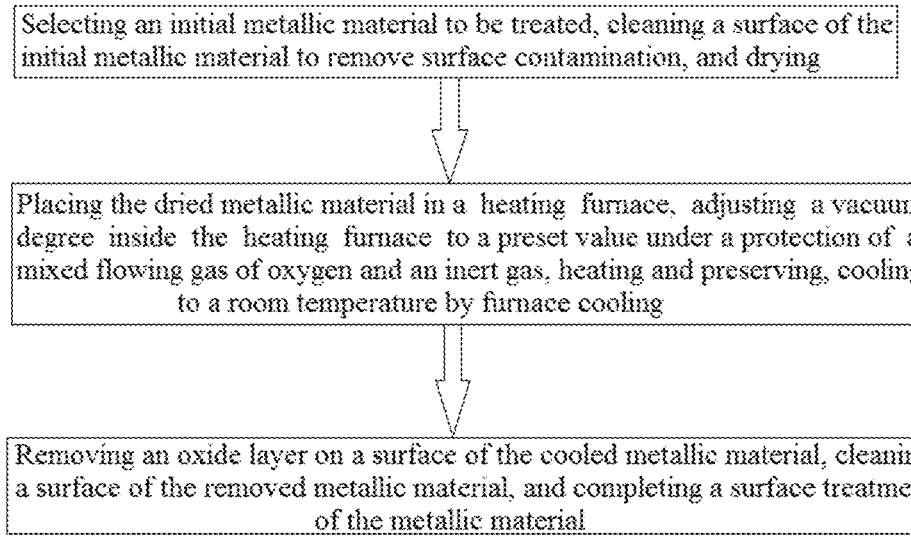
FIG. 1 is a flow chart of the present invention.

Referring to FIG. 1 of the drawings, a surface treatment method of metallic materials provided by the present invention comprises steps of:

(S1) cleaning a surface of an initial metallic material to be treated, and then drying; and (S2) placing the dried metallic material in a heating furnace, adjusting a vacuum degree inside the heating furnace to $10^{-3}$ Pa-$10^5$ Pa under a protection of a mixed flowing gas of oxygen and an inert gas, heating and preserving with a preserving time larger than 1 min, cooling to a room temperature by furnace cooling, removing an oxide layer on a surface of the cooled metallic material, cleaning a surface of the removed metallic material, and completing a surface treatment of the metallic material to be treated, wherein a heating temperature is larger than a destruction temperature of a dense and native oxide at the surface of the initial metallic material.

Preferably, the metallic material is vanadium, niobium, tantalum, chromium, molybdenum, magnesium, titanium, zirconium, iron, vanadium alloy, niobium alloy, tantalum alloy, chromium alloy, molybdenum alloy, magnesium alloy, titanium alloy, zirconium alloy, or steel, wherein: a content of vanadium, niobium, tantalum, chromium, molybdenum, magnesium, titanium, zirconium, iron in the vanadium alloy, niobium alloy, tantalum alloy, chromium alloy, molybdenum alloy, magnesium alloy, titanium alloy, zirconium alloy, and steel exceeds 5 at. %, respectively.

Preferably, a volume ratio of oxygen in the mixed gas formed by the oxygen and the inert gas is in a range of 0.01% to 100%.

Preferably, the oxide layer on the surface of the cooled metallic material is removed by at least one process selected from a group consisting of mechanical grinding, turning, pickling, and electrolytic polishing.

First Embodiment

Take a metallic pure niobium rod with a diameter of 4 mm and a length of 8 mm, cut a surface of the niobium rod with a grinding machine, and clean the cut niobium rod with acetone, place the cleaned niobium rod in a tube furnace, introduce a mixed gas of oxygen and argon gas with a flowing rate of 1000 sccm into the tube furnace, wherein a volume ratio of oxygen in the mixed gas is 0.2%, remain a vacuum degree inside the tube furnace to be 250 Pa through controlling a pumping speed of a mechanical pump, heating to 1000° C. at a heating rate of 10° C./min and preserving for 1 h, cooling to a room temperature via furnace cooling, removing an oxide layer on a surface of the cooled niobium rod by grinding with sandpaper, and finally obtain a treated sample.

Figure 2:
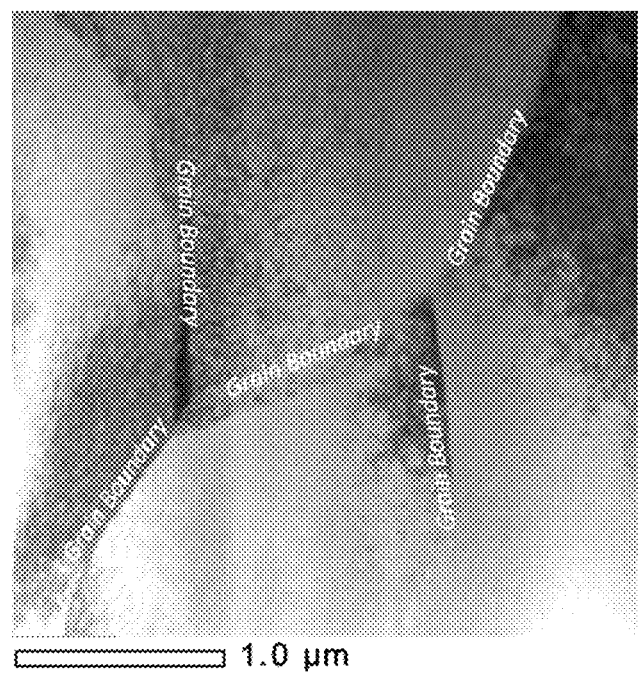
FIG. 2 is a bright field TEM (transmission electron microscope) image of a metallic material according to a first embodiment of the present invention.

Referring to FIG. 2, the obtained sample is characterized by transmission electron microscopy at a position 20 µm away from the topmost surface, and only defects such as dislocation loops which are introduced by the preparation process of the TEM (transmission electron microscope) sample or initially stored inside initial sample can be observed. Obviously, there is no oxide structure formed either at the grain boundary or inside the grain interior.

Figure 3:
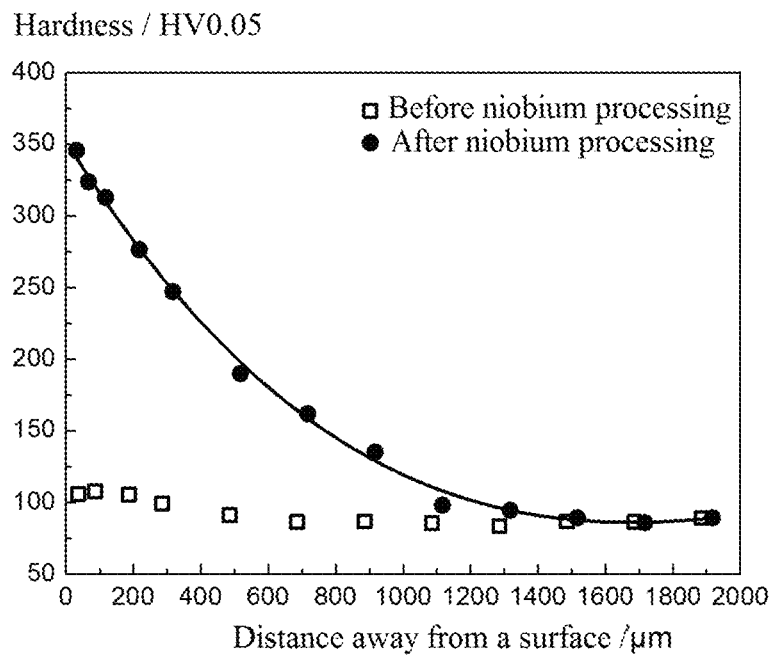
FIG. 3 is a cross-sectional hardness distribution chart of the metallic material according to the first embodiment of the present invention.

Referring to FIG. 3, the obtained sample is cut in the middle, and a hardness distribution thereof is measured from a surface to a core along its radial direction and then the hardness distribution of the obtained sample is compared with an initial sample. As can be seen in FIG. 3, the hardness of the obtained sample is significantly improved within the depth of 1.3 mm from the surface thereof, and gradually decreased from the surface to the core with a gradient distribution. In addition, the hardness at the surface of the obtained sample is 3.5 times that of the initial sample.

Second Embodiment

Take a metallic pure vanadium sheet with a thickness of 1.2 mm, place the vanadium sheet in a tube furnace, introduce a mixed gas of oxygen and argon gas under normal pressure into the tube furnace, wherein a volume ratio of oxygen in the mixed gas is 5%, heating to 650° C. at a heating rate of 10° C./min and preserving for 10 h, cooling to room temperature by furnace cooling, and finally obtaining a sample.

Figure 4:
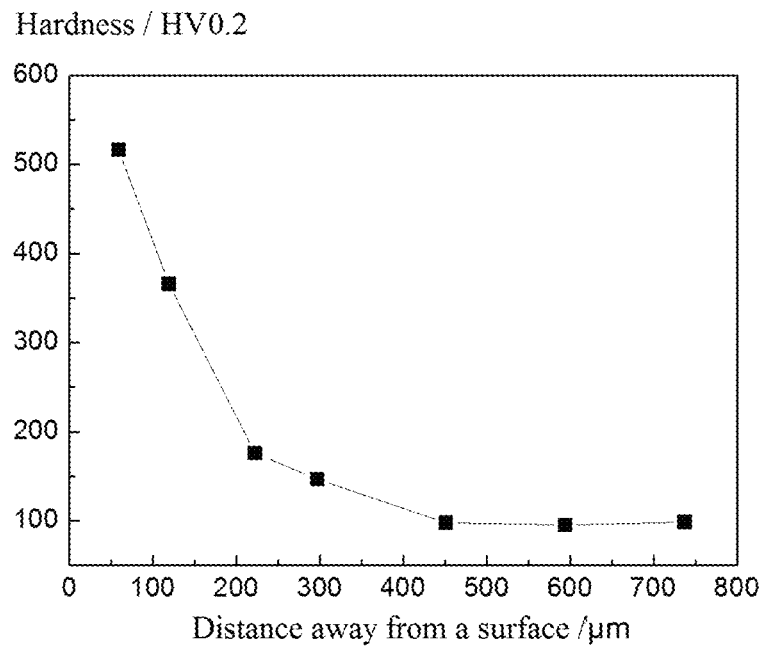
FIG. 4 is a cross-sectional hardness distribution chart of the metallic material according to a second embodiment of the present invention.

Referring to FIG. 4, a surface of the obtained sample is continuously ground and polished to remove the oxide layer obtained by oxygen permeation from the upper surface of the vanadium sheet, and the cross-sectional hardness from the side surface to the core of the obtained sample is measured. It can be seen from FIG. 4 that significant hardening occurs in the range of 450 μm away from the side surface of the obtained sample. In addition, the hardness at the surface of the obtained sample is five times that of the core of the obtained sample, and gradually decreases from the side surface to the core with a gradient distribution.

In addition, those skilled in the art can make other changes within the spirit of the present invention, and these changes in accordance with the spirit of the present invention should be included in the protective scope of the present invention.

What is claimed is:

1. A surface treatment method of metallic materials, comprising steps of:
   (S1) cleaning a surface of an initial metallic material to be treated, and then drying; and
   (S2) placing the dried metallic material in a heating furnace, adjusting a vacuum degree inside the heating furnace to a preset value under a protection of a mixed flowing gas of oxygen and an inert gas, forming an oxide layer at a topmost surface of the dried metallic material while forming a solid solute oxygen beneath the oxide layer with a content of gradient distribution in the dried metallic material by heating and preserving, and cooling to a room temperature by furnace cooling, thereby completing a surface treatment of the metallic material to be treated, wherein:
   a heating temperature is in a range of 650° C.-1000° C. with a corresponding preserving time larger than 10 h; or a heating temperature is equal or larger than 1000° C. with a corresponding preserving time larger than 1 h;
   after cooling to the room temperature by furnace cooling, the step of (S2) further comprises removing the oxide layer and cleaning a surface of the removed metallic material; the oxide layer on the surface of the cooled metallic material is removed by at least one process selected from the group consisting of mechanical grinding, turning, pickling, and electrolytic polishing, so that no oxide phase is left at a topmost surface of the cooled metallic material;
   the initial metallic material is vanadium, niobium, tantalum, chromium, molybdenum, magnesium, zirconium, iron, vanadium alloy, niobium alloy, tantalum alloy, chromium alloy, molybdenum alloy, magnesium alloy, zirconium alloy, or steel; when the initial metallic material is the vanadium alloy, the niobium alloy, the tantalum alloy, the chromium alloy, the molybdenum alloy, the magnesium alloy, the zirconium alloy, or the steel, a content of vanadium, niobium, tantalum, chromium, molybdenum, magnesium, zirconium, iron in the vanadium alloy, niobium alloy, tantalum alloy, chromium alloy, molybdenum alloy, magnesium alloy, zirconium alloy, or steel exceeds 5 at. % (atomic percentage), respectively;
   a volume content of the oxygen in the mixed gas formed by the oxygen and the inert gas is in a range of 0.2% to 5%;
   the vacuum degree inside the heating furnace is adjusted to 250 Pa-$10^5$ Pa under the protection of the mixed flowing gas of the oxygen and the inert gas.

* * * * *